United States Patent
Ho et al.

(10) Patent No.: US 9,048,815 B2
(45) Date of Patent: Jun. 2, 2015

(54) METHOD FOR PERFORMING DYNAMIC IMPEDANCE MATCHING AND A COMMUNICATION APPARATUS THEREOF

(75) Inventors: Chien-Ting Ho, Taoyuan (TW);
Chun-Wei Hsu, Taoyuan (TW);
Chung-Chi Lai, Taoyuan (TW);
Chih-Chin Su, Taoyuan (TW);
Wan-Ming Chen, Taoyuan (TW)

(73) Assignee: HTC CORPORATION, Taoyuan (TW)

( * ) Notice: Subject to any disclaimer, the term of this patent is extended or adjusted under 35 U.S.C. 154(b) by 578 days.

(21) Appl. No.: 13/334,991

(22) Filed: Dec. 22, 2011

(65) Prior Publication Data

US 2012/0249260 A1    Oct. 4, 2012

(30) Foreign Application Priority Data

Apr. 1, 2011  (TW) .............................. 100111661 A (51) Int. Cl.
*H03H 7/40*  (2006.01)
(52) U.S. Cl.
CPC ....................................... *H03H 7/40* (2013.01)
(58) Field of Classification Search
CPC ....................................................... H03H 7/40
USPC ................................................. 333/17.3, 33
See application file for complete search history.

(56) References Cited

U.S. PATENT DOCUMENTS

| | | | |
|---|---|---|---|
| 8,320,856 B2 | 11/2012 | Rofougaran et al. |
| 2008/0129610 A1 | 6/2008 | Tsfati et al. |
| 2008/0186105 A1 | 8/2008 | Scuderi et al. |
| 2010/0073103 A1 | 3/2010 | Spears et al. |
| 2010/0182216 A1 | 7/2010 | Schmidhammer |
| 2010/0321086 A1 | 12/2010 | See et al. |

FOREIGN PATENT DOCUMENTS

| | | |
|---|---|---|
| EP | 2151921 A1 | 2/2010 |
| TW | 201110573 A | 3/2011 |
| WO | WO-2009027182 A1 | 3/2009 |

OTHER PUBLICATIONS

Andre Van Bezooijen et al: "Adaptive Impedance-Matching Techniques for Controlling L Networks", IEEE Transactions on Circuits and Systems—I: Regular Papers, IEEE, US, vol. 57, No. 2, Feb. 1, 2010, pp. 495-505, Xp011281597, Issn:1549-8328, Doi:10.1109/Tcsi.2009.2023764 *Section II*.

*Primary Examiner* — Stephen E Jones
(74) *Attorney, Agent, or Firm* — Rabin & Berdo, P.C.

(57) ABSTRACT

Method for performing dynamic impedance matching and communication apparatus thereof are provided. With respect to an operating band of an impedance matching circuit of a communication device, a first number of times of tuning are performed on a first element of an impedance matching circuit, and a second number of times of tuning are performed on a second element of the impedance matching circuit, wherein the first number is different from the second number.

11 Claims, 8 Drawing Sheets

METHOD FOR PERFORMING DYNAMIC IMPEDANCE MATCHING AND A COMMUNICATION APPARATUS THEREOF

This application claims the benefit of Taiwan application Serial No. 100111661, filed Apr. 1, 2011, the subject matter of which is incorporated herein by reference.

BACKGROUND

1. Technical Field

The disclosure relates in general to a method for impedance matching and a communication apparatus thereof, and more particularly to a method for performing dynamic impedance matching and a communication apparatus thereof.

2. Description of the Related Art

For a communication device, such as a mobile phone, a smart phone, an e-book, a tablet PC or other wireless communication apparatuses, the quality of communication may be affected when the user applies the device in different environments or by the manner the user holds or is close to it. To the worse, problems such as poor reception quality, weak signal, and missed calls might even arise. As an example, the customers discovered the problem of poor reception of a smart phone available in the market after purchase, due to the signal shielding effect which might occur when the smart phone is placed too close to the user's face or is grabbed tightly. The manufacturer of the smart phone then has to provide a protection case for the customers as a remedy for reducing the problem of poor reception.

Consequently, the user will end up with unpleasant experience with the communication device.

SUMMARY

The disclosure is directed to a method for performing dynamic impedance matching and a communication apparatus thereof. The communication apparatus can perform dynamic impedance matching to compensate for the effect of impedance matching, which occurs under a certain environment or when the apparatus is held by or close to a user, so as to maintain the quality of communication.

According to an aspect of the disclosure, a method for performing dynamic impedance matching is provided. With respect to an impedance matching circuit of a communication apparatus, a first number of times of tuning are performed on a first element of an impedance matching circuit, and a second number of times of tuning are performed on a second element of the impedance matching circuit, wherein the first number is different from the second number.

An embodiment of the aspect of the disclosure is provided below. An impedance matching circuit of a communication apparatus is switched to an operating band. A first number of tuning voltages are applied on a first element of the impedance matching circuit, and one tuning voltage is selected from a first number of tuning voltages and used as an operating voltage of the first element. A second number of tuning voltages are applied on a second element of the impedance matching circuit, and one tuning voltage is selected from a second number of tuning voltages and used as an operating voltage of the second element, wherein the first number is different from the second number.

An alternative embodiment of the aspect of the disclosure is provided. An impedance matching circuit of a communication apparatus is switched to an operating band. A first control signal is outputted to a first control terminal of the impedance matching circuit for performing a first number of times of setting on a first parameter of the first control signal and selecting one setting value from a first number of setting values of the first parameter to generate an operating signal for the first control terminal. A second control signal is outputted to a second control terminal of the impedance matching circuit for performing a second number of times of setting on a second parameter of the second control signal and selecting one setting value from a second number of setting values of the second parameter to generate an operating signal for the second control terminal, wherein the first number is different from the second number.

According to another aspect of the disclosure, a communication apparatus is provided. The communication apparatus comprises an antenna, an impedance matching circuit, a detection circuit, and a control unit. The impedance matching circuit is coupled to the antenna and has a plurality of control terminals for controlling the impedance of the impedance matching circuit. The detection circuit is coupled to the impedance matching circuit and used for generating a feedback signal. The control unit switches the impedance matching circuit to an operating band and outputs a first control signal to a first control terminal of the control terminals for performing a first number of times of setting on a first parameter of the first control signal and selecting one setting value from a first number of setting values of the first parameter to generate an operating signal for the first control terminal. The control unit outputs a second control signal to a second control terminal of the control terminals for performing a second number of times of setting on a second parameter of the second control signal and selecting one setting value from a second number of setting values of the second parameter to generate an operating signal for the second control terminal. The first number is different from the second number.

The above and other aspects of the disclosure will become better understood with regard to the following detailed description of the non-limiting embodiment(s). The following description is made with reference to the accompanying drawings.

DETAILED DESCRIPTION

Figure 1:
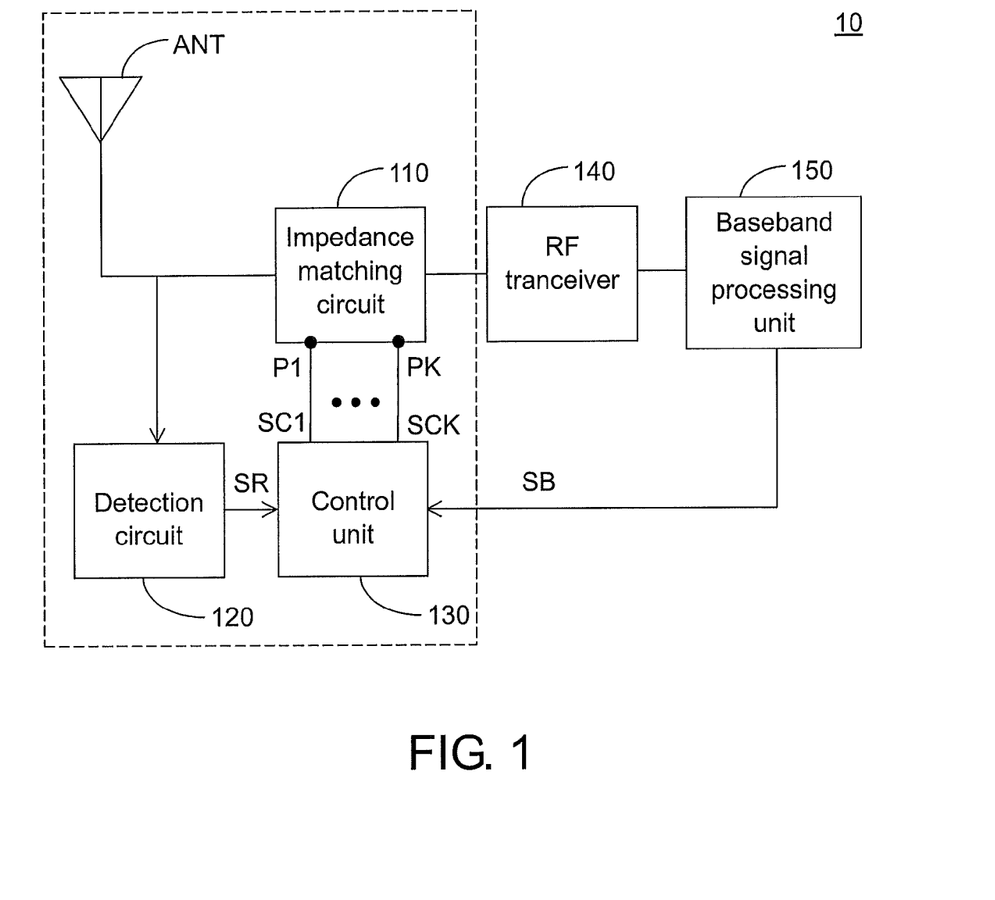
FIG. 1 shows a block diagram of an embodiment of a communication apparatus for performing dynamic impedance matching.
Figure 5A:
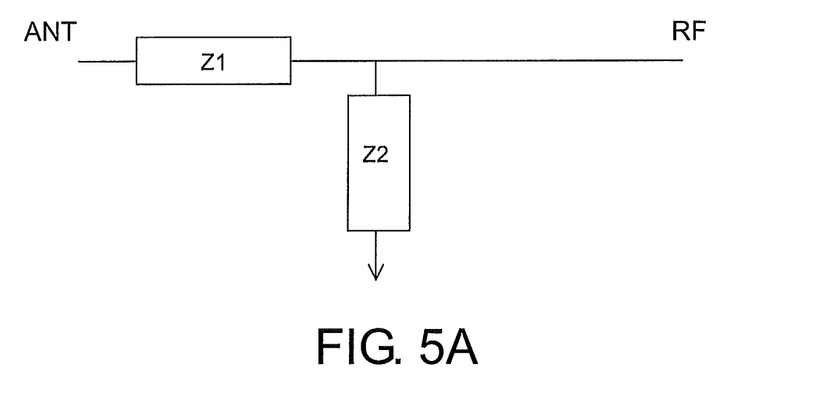
FIGS. 5A-5C are circuit diagrams of embodiments for a matching circuit of the adjustable elements of an impedance matching circuit for performing dynamic impedance matching.
Figure 5B:
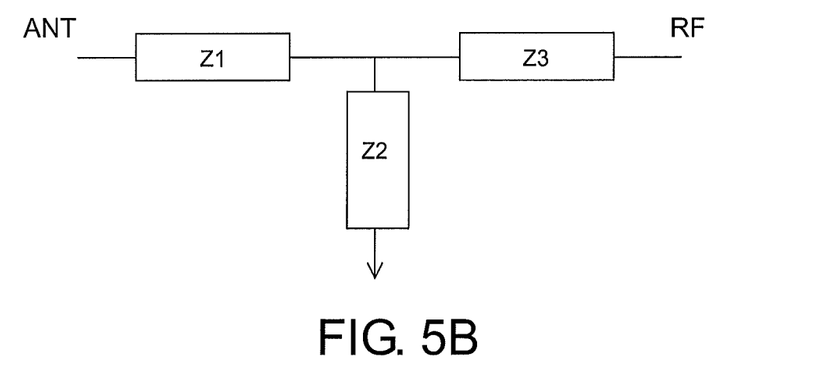
Figure 5C:
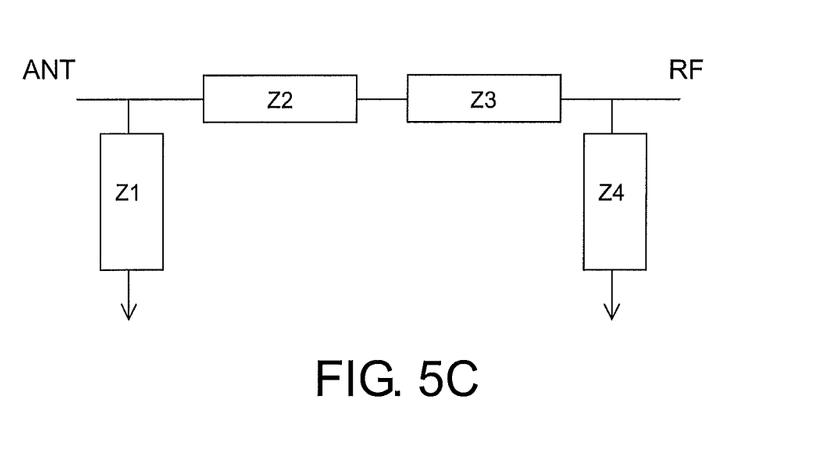

Embodiments of a method for performing dynamic impedance matching and a communication apparatus thereof are provided. FIG. 1 shows a block diagram of an embodiment of a communication apparatus for performing dynamic impedance matching. In FIG. 1, the communication apparatus 10 can be implemented as such as a mobile phone, a smart phone, an e-book, a tablet PC or other apparatus with wireless communication. The communication apparatus 10 comprises an antenna ANT, an impedance matching circuit 110, a detection circuit 120, and a control unit 130. The antenna ANT is used for receiving or sending a signal. The impedance matching circuit 110 is coupled to the antenna ANT and has a plurality of control terminals P1, P2 . . . PK for controlling the impedance of the impedance matching circuit 110, so that the impedance matching circuit 110 can achieve impedance matching with the antenna ANT. From another point of view, the impedance matching circuit 110 can also include adjustable elements realized by a circuit including such as adjustable capacitors, adjustable inductors or adjustable resistors, or adjustable elements, as indicated in any embodiment of FIGS. 5A-5C. The impedance matching circuit 110 may further include unadjustable impedance elements. In FIGS. 5A-5C, the designation RF indicates being connected to another radio frequency circuit, and the designation ANT indicates being coupled to an antenna. The detection circuit 120 is coupled to the impedance matching circuit 110 and used for generating a feedback signal SR. For example, the detection circuit 120 detects the reflection of signal, and converts the reflected signal into a feedback signal SR according to the intensity of the reflected signal. For example, the intensity of the reflection of signal is denoted by a voltage value. The feedback signal SR can be used for tuning impedance matching. The control unit 130 outputs control signals SC1-SCK to the control terminals P1-PK for controlling the impedance of the impedance matching circuit 110 to achieve impedance matching, wherein K is an integer greater than 1.

Based on an embodiment of the closed-loop tunable circuit structure (denoted by dotted lines) of FIG. 1, the communication apparatus 10 can be implemented as different communication apparatus as mentioned above. In practical application, the communication apparatus 10 can further be combined with other circuits or elements such as the radio frequency transceiver 140 and the baseband signal processing unit 150 exemplified in FIG. 1. Thus, the implementation of the circuit of the communication apparatus for performing dynamic impedance matching is not limited to the implementation in FIG. 1.

Figure 2A:
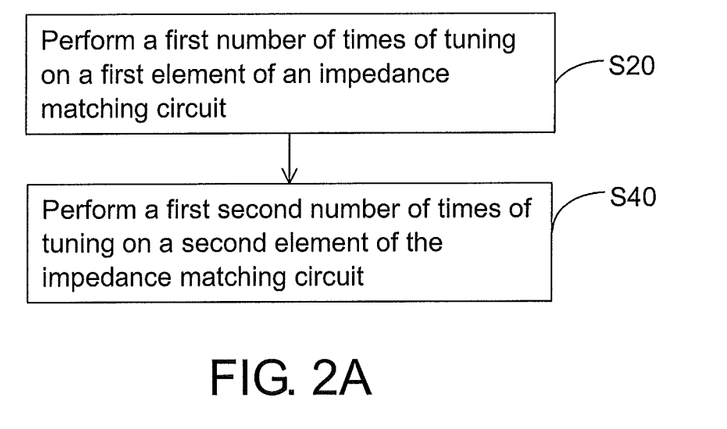
FIG. 2A shows a flowchart of an embodiment of a method for performing dynamic impedance matching.

The communication apparatus 10 of the present embodiment can perform dynamic impedance matching. Referring to FIG. 2A, a flowchart of an embodiment of a method for performing dynamic impedance matching is shown. The method is applicable to the communication apparatus 10 for performing dynamic impedance matching.

In FIG. 2A, the method performs dynamic impedance matching on an impedance matching circuit (such as the impedance matching circuit 110) of a communication apparatus (such as the communication apparatus 10) in an operating band. The method includes the following steps. In step S20, a first number of times of tuning are performed on a first element of the impedance matching circuit (such as the element Z3 of FIG. 5B). Next, in step S40, a second number of times of tuning are performed on a second element (such as the elements Z1 and Z2 of FIG. 5B) of the impedance matching circuit, wherein the first number is different from the second number. For example, 3 times and 2 times of tuning are respectively performed on the elements Z1 and Z2.

With respect to a certain operating band, the adjustable elements (such as the elements Z1, Z2 and Z3 of the impedance matching network of FIG. 5B) of the impedance matching circuit can be divided into at least two categories. Steps S20 and S40 are to perform different numbers of times of tuning for achieving impedance matching on the at least two categories of elements respectively. In some embodiments, step S40 can be performed for at least one or a number of times for sequentially tuning other adjustable elements that can be regarded as second elements of the impedance matching circuit.

In some embodiments, the categorization of the adjustable elements of the impedance matching circuit can be based on the sensitivity of the adjustable elements with respect to the impedance matching in a certain operating band. For example, in step S20, the first element is the sensitive element with respect to the operating band, and in step S40, the second element is the sub-sensitive element with respect to the operating band. In other words, with respect to the operating band, the sensitivity of the first element is higher than the sensitivity of the second element. Since the first element has higher sensitivity with respect to the operating band, a first number of times of tuning are performed on the first element in step S20, and the first number of times of tuning are greater than the number of times of tuning performed on the second element as in step S40, that is, the second number of times. In other words, more times of tuning (such as 3, 5 or 10 times of tuning) are performed on the element with higher sensitivity which has greater influence on the effect of impedance matching, so that the resulted impedance matching is more accurate; relatively fewer times of tuning (such as 2 or 4 times of tuning) are performed on the element with lower sensitivity (that is, the sub-sensitive element) which has lesser influence on the effect of impedance matching or requires lower level of accuracy. In this manner, the above embodiments of the communication apparatus help to compensate for the effect on impedance matching in different situations to improve the quality of communication, such as the communication apparatus being exposed in different environments, or being held by a user in a different manner, or different parts of the body of the communication apparatus having relative movement (exemplarily but not restrictively, the slide casing or the physical QWERT keyboard).

In some embodiments, with respect to a certain operating band such as HSPA/WCDMA: 900/2100 MHz and GSM: 850/900/1800/1900 MHz (frequency bands of a mobile communication network), a first number of times of tuning are performed on the first element with greater sensitivity according to the information of a frequency band and the information of the sensitivity of the adjustable elements of the impedance matching circuit with respect to the frequency band.

In an example of L-type matching network as shown in FIG. 5A, sensitivity of the element Z1 is greater than the sensitivity of the element Z2 with respect to a certain frequency band such as GSM 1800. For the example, a first number of times of tuning are performed on the element Z1 in step S20 first, and then a second number of times of tuning are performed on the element Z2 in step S40 subsequently. In an example of the T-type matching network of FIG. 5B, the sensitivity of the element Z3 is greater than the sensitivity of the elements Z1 and Z2 with respect to a certain frequency band such as WCDMA: 2100. For the example, a first number of times of tuning are performed on the element Z3 (that is, the first element) in step S20 first, and then corresponding numbers of times of tuning are respectively performed on the elements Z1 and Z2 (that is, the second element) in step S40 subsequently. In an example of the π-type matching network of FIG. 5C, the sensitivity of the element Z2 is greater than the sensitivity of other elements with respect to a certain frequency band (such as a low frequency band). With respect to another frequency band (such as a high frequency band), the sensitivity of the element Z4 is greater than the sensitivity of other elements. For the example, if the communication apparatus 10 operates in the low frequency band, the communication apparatus 10 performs a first number of times of tuning on the element Z2 (that is, the first element) in step S20 first. If the communication apparatus 10 operates in the high frequency band, the communication apparatus 10 performs a corresponding first number of times of tuning on the element Z4 in step S20, wherein the first number corresponding to the element Z4 can be different from the first number corresponding to the element Z2. When the communication apparatus 10 performs step S40, the procedures can be obtained by analogy. That is, with respect to a specific frequency band in which the communication apparatus 10 operates, corresponding numbers of times of tuning are respectively performed on the other elements (that is, multiple elements are regarded as second elements).

The above information of the operating band and information of the sensitivity of the adjustable elements of the impedance matching circuit with respect to a specific operating band can be obtained through experiments and can be recorded in the communication apparatus 10. For example, with respect to a certain low frequency band and a certain high frequency band of the π-type matching network of FIG. 5C, the influence on signal intensity when tuning is performed on the adjustable elements can be obtained through experiments or computer simulation, and the obtained data are illustrated in Table 1, wherein elements Z1-Z4 respectively denotes adjustable elements L1, C1, L2 and C2:

TABLE 1

|  | Element L1 | Element C1 | Element L2 | Element C2 |
| --- | --- | --- | --- | --- |
| Low Frequency Band | 3 dB | 4 dB | 1 dB | 1 dB |
| High Frequency Band | 0.5 dB | 1 dB | 2.5 dB | 3.5 dB |

Which element of the impedance matching circuit is the sensitive element with respect to one of the frequency bands can be obtained from the above data, and the greater the value in the data, the higher the sensitivity of the element with respect to the frequency band. For example, with respect to frequency bands (such as HSPA/WCDMA: 900/2100 MHz or GSM: 850/900/1800/1900 MHz) for a mobile communication network, the information or relationship of the frequency bands and the sensitive elements can be obtained respectively.

Figure 2B:
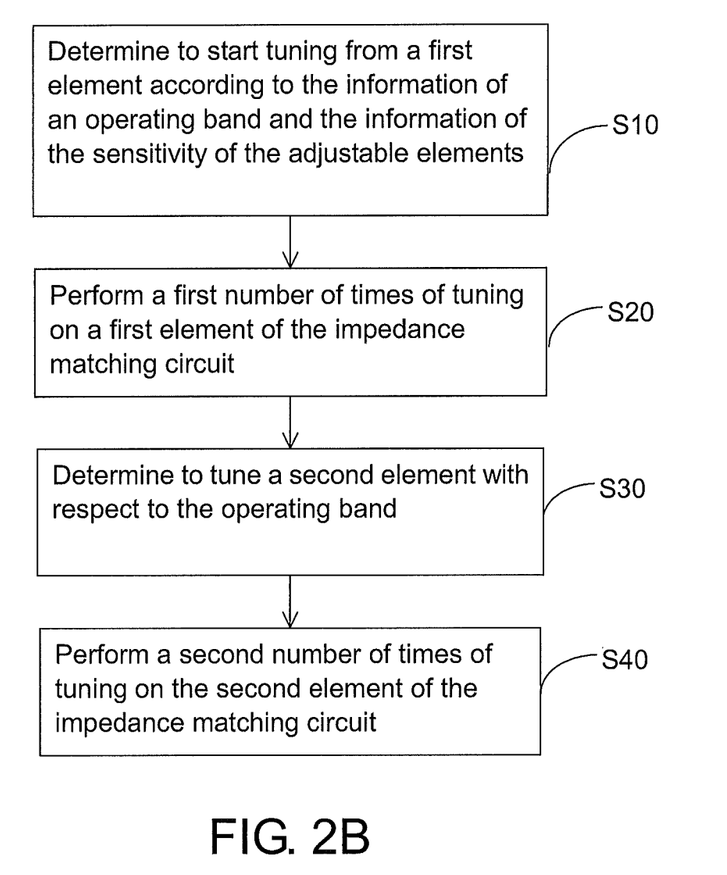
FIG. 2B shows a flowchart of another embodiment of a method for performing dynamic impedance matching.

In some embodiments, the communication apparatus 10 can implement the embodiment of the method for performing dynamic impedance matching of FIG. 2A according to the information or relationship of the frequency bands and the sensitive element. Other embodiments based on FIG. 2A may include the following steps. Referring to FIG. 2B, as indicated in step S10, it is determined that tuning starts with a first element (such as the element Z3 of FIG. 5B) according to the information of an operating band and the information of the sensitivity of the adjustable elements with respect to the frequency band. That is, in FIG. 2A, step S20 comes before step S40. In some embodiments, step S40 can be performed subsequently for at least one time to sequentially perform tuning on other adjustable element of the impedance matching circuit that are regarded as a second element. In some examples, with respect to the operating band, step S30 realizes the step of tuning of a second element of (such as elements Z1 and Z2 of FIG. 5B) of the other adjustable elements according to the above information or other adjustable elements.

According to the above embodiment of FIG. 2A, the control unit 130 of the communication apparatus 10 can be used for implementing embodiments of dynamic impedance matching.

Figure 3A:
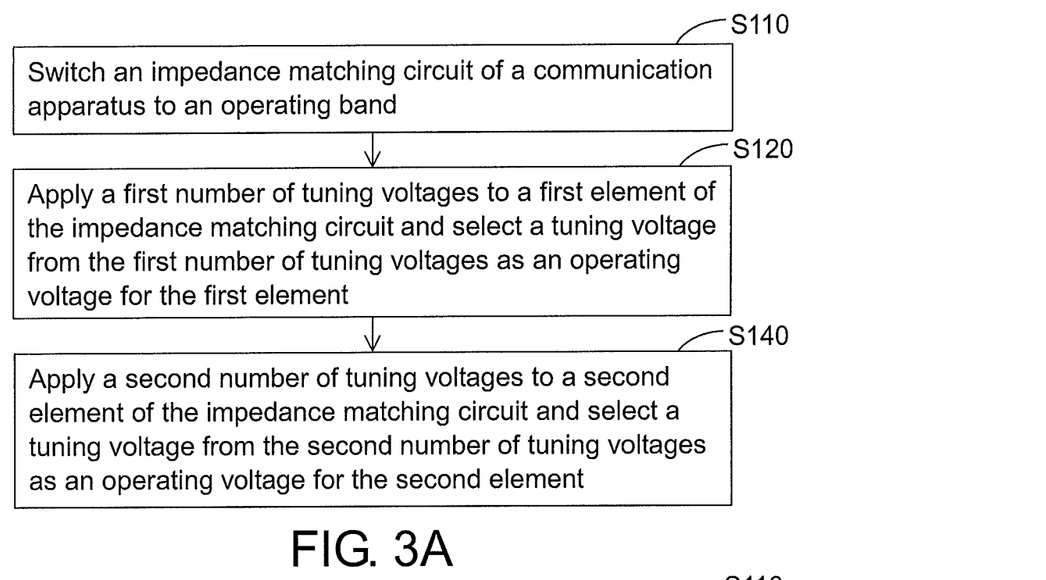
FIGS. 3A-3C are flowcharts of other embodiments of a method for performing dynamic impedance matching.
Figure 4A:
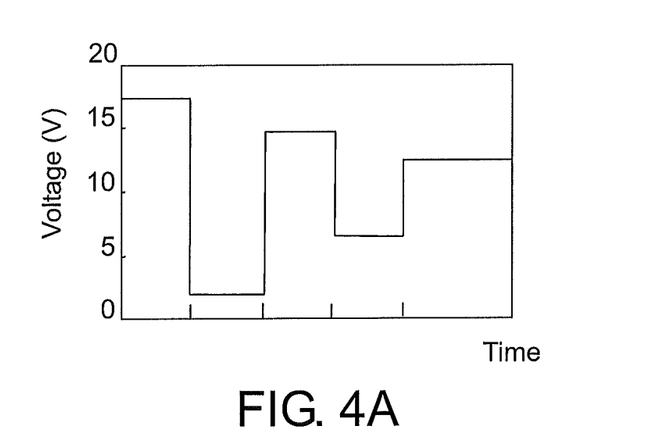
FIGS. 4A-4C are embodiments of waveforms of a control signal for tuning in an embodiment of a method for performing dynamic impedance matching.

The step S20 or S40 of performing a certain number of times of tuning on an adjustable element (such as element Z3 of FIG. 5B) of the impedance matching circuit can be implemented in many different ways. Referring to FIG. 3A, a flowchart of an alternative embodiment of a method for performing dynamic impedance matching is shown. The method includes the following steps. In step S110, an impedance matching circuit of a communication apparatus is switched to an operating band. In step S120, a first number of tuning voltages are applied to a first element of the impedance matching circuit, and one tuning voltage is selected from a first number of tuning voltages and used as an operating voltage for the first voltage control element. In step S140, a second number of tuning voltages are applied to a second element of the impedance matching circuit, and one tuning voltage is selected from a second number of tuning voltages and used as an operating voltage for the second voltage control element, wherein the first number is different from the second number. The steps S120 and S140 of the present embodiment of the disclosure can respectively be regarded as an implementation of the steps S20 and S40 of the embodiment of FIG. 2A or 2B, and are particularly suitable for the embodiments in which the adjustable elements are voltage control elements. In the embodiment of FIG. 4A, several tuning voltages are applied to an adjustable element within a fixed time interval or at a frequency sequentially, and one tuning voltages is selected from the tuning voltages and used as an operating voltage. In other embodiments, a corresponding feedback signal can be obtained from the impedance matching circuit sequentially in response to each of the first number (or second number) of tuning voltages so that the feedback signal is used for tuning the impedance matching.

The impedance matching circuit 110 of FIG. 1, which can be implemented as an integrated circuit or a portion of an integrated circuit, has a plurality of control terminals P1, P2 . . . PK, for controlling the impedance of the impedance matching circuit 110. Thus, the control unit 130 can output control signals SC1-SCK to the control terminals for controlling the impedance of the impedance matching circuit 110 to achieve impedance matching.

Figure 3B:
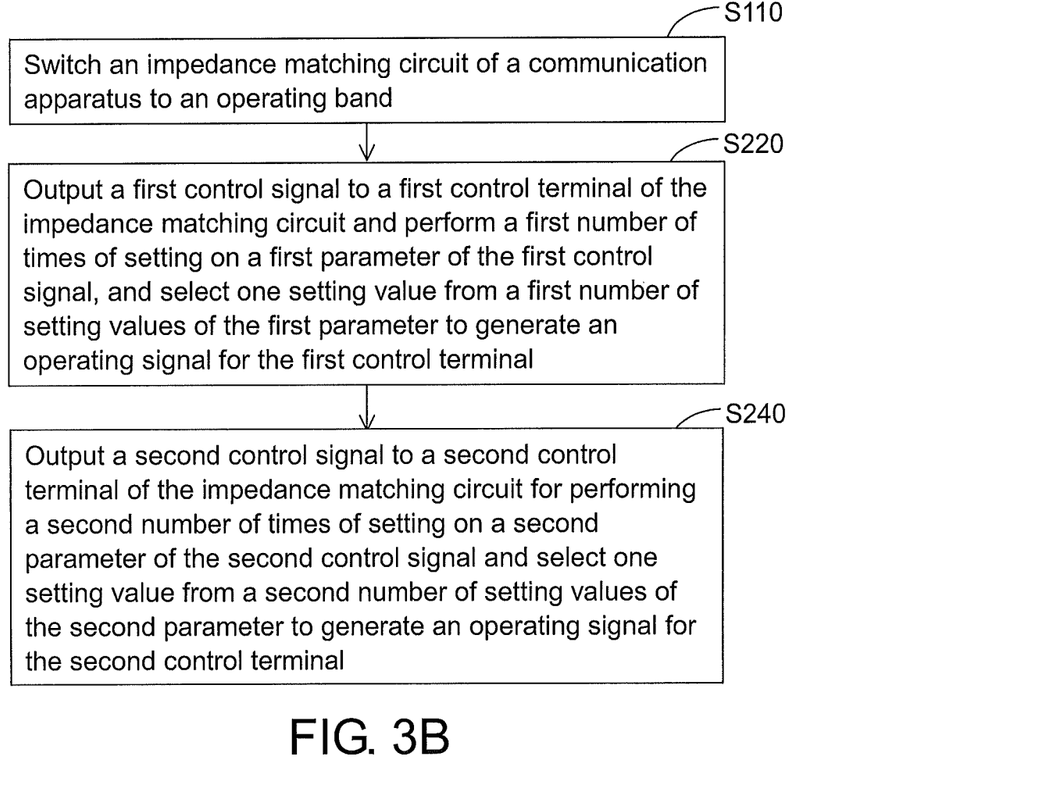

Referring to FIG. 3B, a flowchart of an alternative embodiment of a method for performing dynamic impedance matching is shown is shown. The method includes the following steps. In step S110, an impedance matching circuit of a communication apparatus is switched to an operating band. In step S220, a first control signal is outputted to a first control terminal (such as P1) of the impedance matching circuit (such as 110) for performing a first number of times of setting on a first parameter of the first control signal (such as SC1) and selecting one setting value from a first number of setting values of the first parameter to generate an operating signal for the first control terminal. In step S240, a second control signal (such as SC2, SC3 and so on) is outputted to a second control terminal of the impedance matching circuit (such as P2, P3 and so on) for performing a second number of times of setting on a second parameter of the second control signal and selecting one setting value from a second number of setting values of the second parameter to generate an operating signal for the second control terminal, wherein the first number is different from the second number. The steps S220 and S240 of the present embodiment can respectively be regarded as an implementation of the steps S20 and S40 of the embodiment of FIG. 2A or 2B. Such implementation is applicable to the situation in which the impedance matching circuit controls the adjustable element with a parameter of the control signal. The first and the second parameters are such as the amplitude, the current, the phase difference, the frequency, the values or other parameters of the control signal. Besides, whether the first and the second parameters are the same or different type of parameters depends on the impedance matching circuit implementation.

Figure 4B:
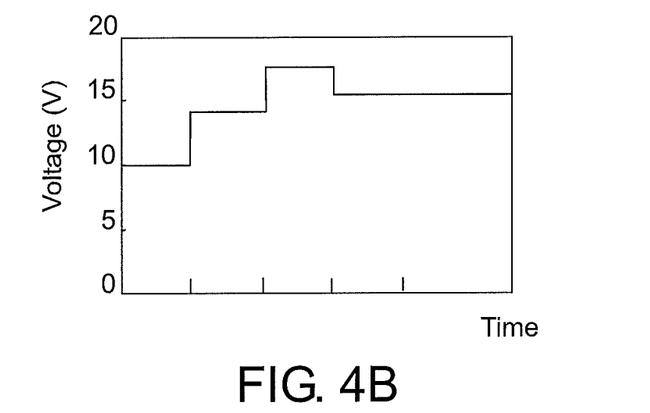
Figure 4C:
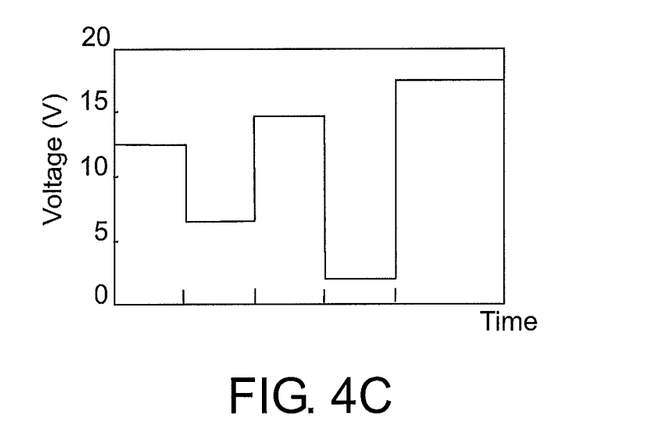

The adjustable elements of the impedance matching circuit may be unknown to the designer. Therefore, in implementation based on the communication apparatus 10 of FIG. 1 and the method of FIG. 3A, multiple times of tuning can be achieved if the control unit 130 outputs a suitable control signal and the parameter of the control signal is set appropriately. For example, if the impedance matching circuit 110 adopts voltage control, then the parameter (that is, the voltage value) of the control signal can correspondingly tune the impedance of the adjustable elements of the impedance matching circuit. With the range and the times of setting of a certain parameter of the control signal, a number of times of tuning can be performed on the impedance of the adjustable elements. FIGS. 4A-4C are an embodiment of using a control signal as a tuning waveform in an embodiment of a method for performing dynamic impedance matching, wherein the tuning is performed one time when the level of the control signal is set. In addition, the impedance matching circuit, for example, has three control terminals corresponding to three adjustable elements of FIG. 5B. For example, the elements Z1-Z3 respectively denote the adjustable capacitors C1, C2 and C3, wherein each adjustable capacitor respective has a range of adjustment. For example, the ranges of adjustment for the adjustable capacitors C1, C2 and C3 are 2.7~8.2 pF, 0.8~2.2 pF, and 0.9~2.7 pF respectively.

Figure 3C:
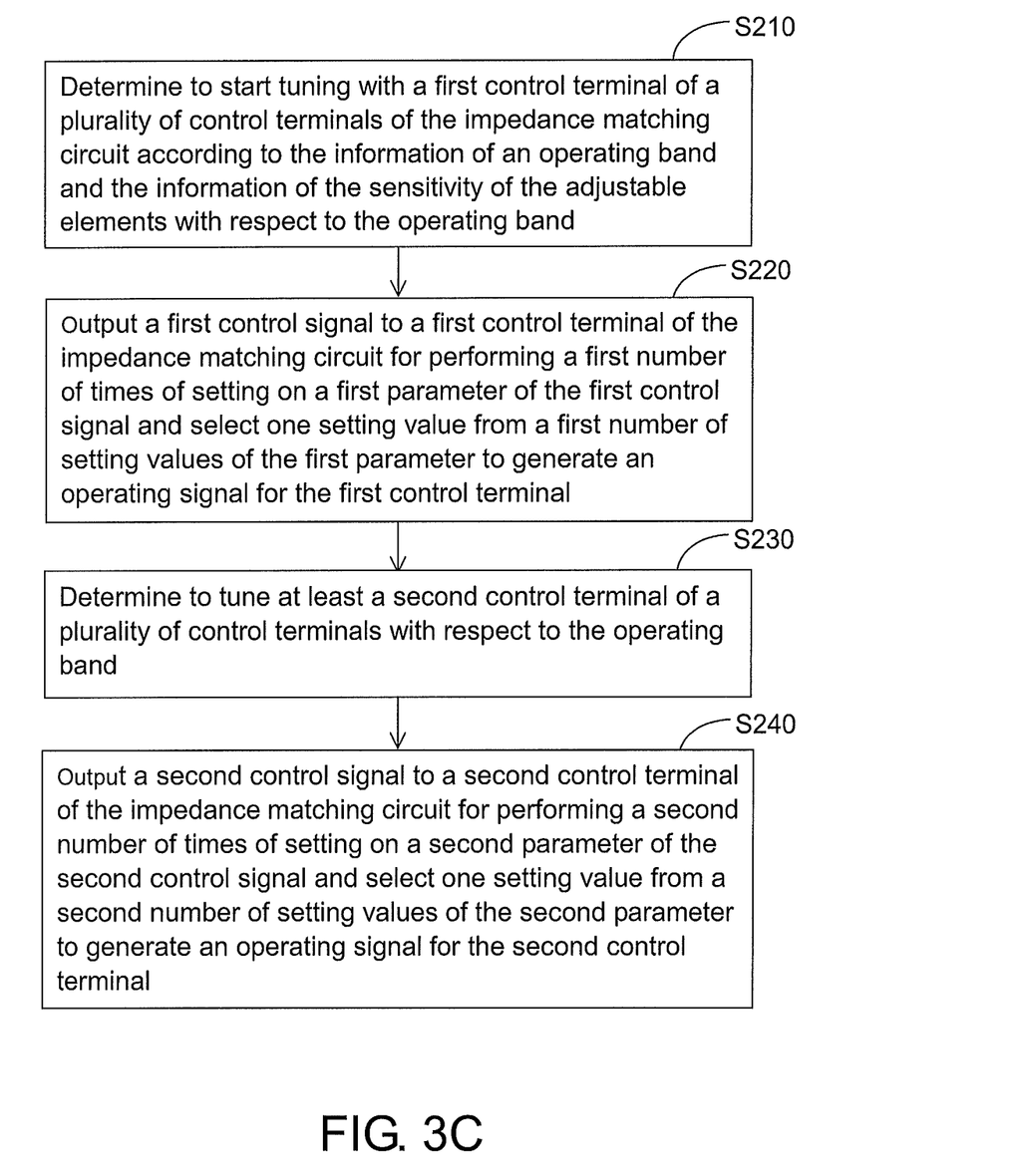

Each of a number of control terminals can control a corresponding one of the adjustable elements, such as those illustrated in FIGS. 5A-5C. In some embodiments, the communication apparatus 10 can implement embodiments based on the method for performing dynamic impedance matching of FIGS. 2B and 3B. FIG. 3C shows a flowchart of an alternative embodiment of a method for performing dynamic impedance matching. In step S210, it is determined that tuning starts with a first control terminal of the control terminals of the impedance matching circuit according to information of an operating band and information of the sensitivity of the adjustable element with respect to operating band. That is, the step S220 of FIG. 3B comes before step S240. In some embodiments, the step S240 is performed subsequently for at least one time for tuning other adjustable element of the impedance matching circuit that can be regarded as a second element. In some examples, such as in step S230, it is determined that tuning with at least a second control terminal of the control terminals of the impedance matching circuit with respect to the operating band. That is, it is determined that at least a second element (such as the elements Z1 and Z2 of FIG. 5B) of the other adjustable elements is tuned, according to the above information with respect to the operating band, or from the other adjustable elements. In other embodiments, a corresponding feedback signal can be obtained from the impedance matching circuit sequentially in response to each of the first number (or second number) of setting values so that the feedback signals are used for tuning the impedance matching.

According to the above disclosure of FIGS. 3A-3C, the control unit 130 of the communication apparatus 10 can also be used for implementing different embodiments of performing dynamic impedance matching.

Other embodiments of the communication apparatus for performing dynamic impedance matching are further disclosed below.

Figure 6:
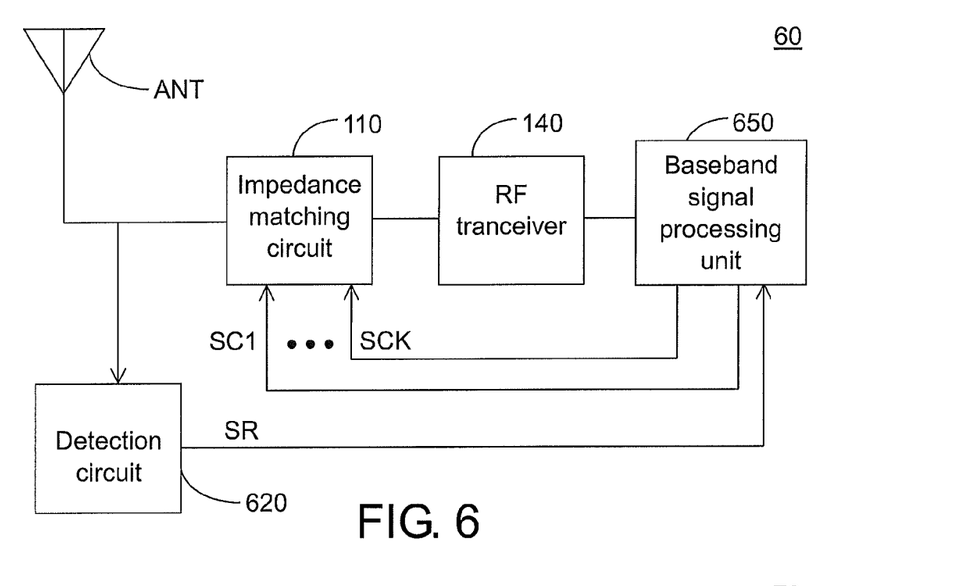
FIGS. 6-8 are block diagrams of alternative embodiments of a communication apparatus for performing dynamic impedance matching.

FIG. 6 shows an alternative embodiment of a communication apparatus for performing dynamic impedance matching. In FIG. 6, the communication apparatus 60 includes an antenna ANT, an impedance matching circuit 110, a detection circuit 620, a radio frequency transceiver 140, and a baseband signal processing unit 650. FIG. 6 is similar to FIG. 1 in that: one terminal of the detection circuit 120 or 620 is coupled between the antenna ANT and the impedance matching circuit 110. The communication apparatus 60 is different from the communication apparatus 10 in that: the baseband signal processing unit 650 of the communication apparatus 60 outputs control signals SC1-SCK for controlling the impedance matching circuit 110, and the other terminal of the detection circuit 620 of the communication apparatus 60 is coupled to the baseband signal processing unit 650. The present embodiment can be regarded as integrating the function or circuit the control unit 130 of the communication apparatus 10 of FIG. 1 into the baseband signal processing unit 150.

Figure 7:
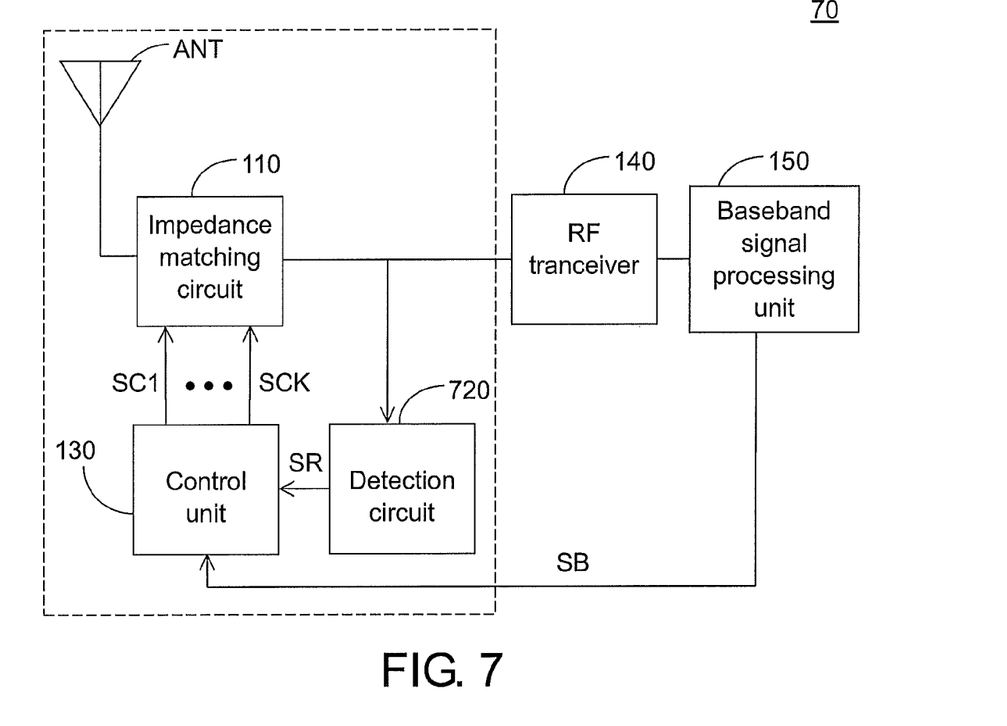

FIG. 7 shows an alternative embodiment of a communication apparatus for performing dynamic impedance matching. In FIG. 7, the communication apparatus 70 includes an antenna ANT, an impedance matching circuit 110, a detection circuit 720, a control unit 130, a radio frequency transceiver 140, and a baseband signal processing unit 150. The communication apparatus 70 of FIG. 7 is different from the communication apparatus 10 of FIG. 1 in that: one terminal of the detection circuit 720 of the communication apparatus 70 is coupled between the radio frequency transceiver 140 and the impedance matching circuit 110, so that the detection circuit 720 detects the reflection of signal and generates a feedback signal SR accordingly. Other elements remain the same, and the similarities are not repeated for the sake of brevity.

Figure 8:
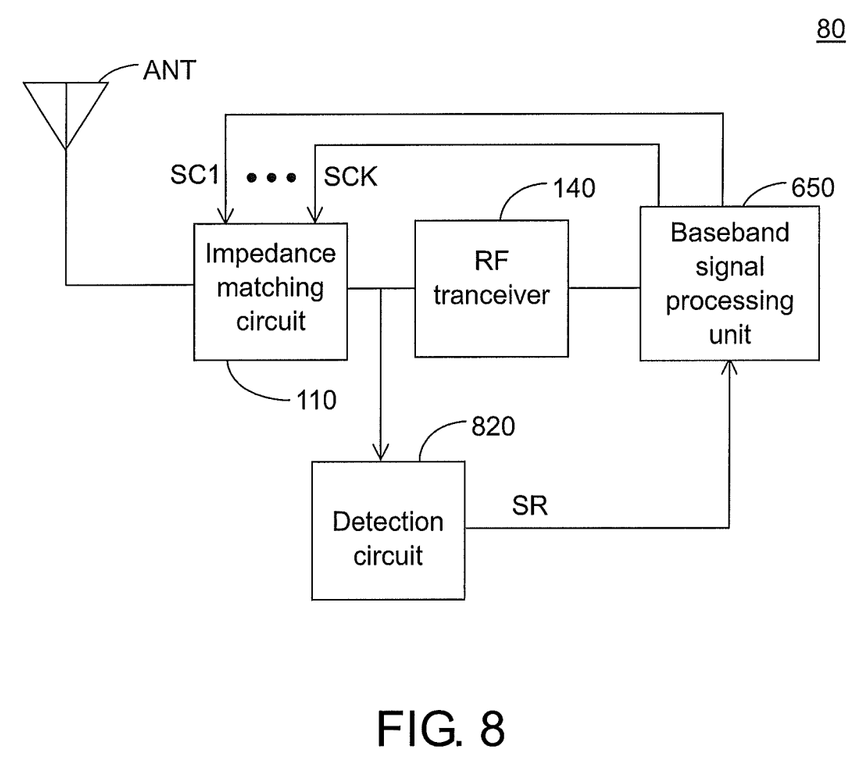

FIG. 8 shows an alternative embodiment of a communication apparatus for performing dynamic impedance matching. In FIG. 8, the communication apparatus 80 includes an antenna ANT, an impedance matching circuit 110, a detection circuit 820, a radio frequency transceiver 140, and a baseband signal processing unit 650. FIG. 8 is similar to FIG. 7 in that: one terminal of the detection circuit 820 or 720 is coupled between the radio frequency transceiver 140 and the impedance matching circuit 110, so that the detection circuit 820 or 720 detects the reflection of signal and generates a feedback signal SR accordingly. The communication apparatus 80 is different from the communication apparatus 70 in that: the baseband signal processing unit 650 of the communication apparatus 80 outputs control signals SC1-SCK for controlling the impedance matching circuit 110, and the other terminal of the detection circuit 820 of the communication apparatus 80 is coupled to the baseband signal processing unit 650 for outputting the feedback signal SR. The present embodiment can be regarded as integrating the function or circuit the control unit 130 of the communication apparatus 70 of FIG. 7 into the baseband signal processing unit 150.

In some embodiments of FIGS. 2A-2B or 3A-3C and the embodiment of FIG. 1 or FIG. 7, the control unit 130 and the baseband signal processing unit 150 are coupled for obtaining the information of an operating band. In other embodiments, the information of an operating band can be built in the control unit 130 or read from other circuits such as a memory.

The control unit 130 or the baseband signal processing unit 150 or 650 disclosed above can be implemented by a processor, a digital signal processor or a programmable integrated circuit, such as micro-controller, field programmable gate array (FPGA) or application specific integrated circuit (ASIC).

In the above embodiments, the sensitive element is exemplified by the first element but the disclosure is not limited thereto. In step S20, S120 or S220 of other embodiments, the first element can be defined as an element with the sensitivity with respect to an operating which is lower than the sensitivity of the second element with respect to the operating band. Thus, the first number of times (or the first number) can be set to be smaller than the second number of times (or the second number). That is, in step S20, S120 or S220 of these embodiments, tuning is performed on the adjustable element with lower sensitivity first. Next, in step S40, S140 or S240, tuning is performed on the adjustable element with higher sensitivity subsequently.

The embodiments of a method for performing dynamic impedance matching and a communication apparatus thereof are disclosed above. Impedance mismatching may occur when the communication apparatus is exposed in different environments or a user holds the communication apparatus in a different manner or different parts of the body of the communication apparatus generate relative movement. According to the above embodiments, the communication apparatus can dynamically compensate for the influence of different situations of usage on impedance matching, so as to improve the quality of communication. In some embodiments, tuning is performed on adjustable element with higher sensitivity first, so that the speed of dynamic impedance matching is increased.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A communication apparatus, the apparatus comprising:
an antenna;
an impedance matching circuit coupled to the antenna, wherein the impedance matching circuit has a plurality of control terminals for controlling an impedance of the impedance matching circuit;
a detection circuit, coupled to the impedance matching circuit, for generating a feedback signal; and
a control unit for switching the impedance matching circuit to an operating band, wherein the control unit outputs a first control signal to a first control terminal of the control terminals for performing a first number of times of setting on a first parameter of the first control signal and selecting one from the first number of setting values of the first parameter to generate an operating signal for the first control terminal, the control unit further outputs a second control signal to a second control terminal of the control terminals for performing a second number of times of setting on a second parameter of the second control signal and selecting one from the second number of setting values of the second parameter to generate an operating signal for the second control terminal, and the first number is different from the second number;
wherein the control unit, according to information of sensitivity of the operating band and the adjustable elements with respect to the operating band, outputs the first control signal to the first control terminal and performs the first number of times of setting on a first parameter of the first control signal.

2. The communication apparatus according to claim 1, wherein the control unit sequentially performs the first number of times of setting at a frequency, and the first number of setting values of the first parameter are different from each other.

3. The communication apparatus according to claim 1, wherein the first control terminal is for controlling a first element of the impedance matching circuit, the second control terminal is for controlling a second element of the impedance matching circuit, and the sensitivity of the first element with respect to operating band is lower than the sensitivity of the second element with respect to operating band.

4. The communication apparatus according to claim 1, wherein the first number is greater than the second number, the first control terminal is for controlling a first element of the impedance matching circuit, the second control terminal is for controlling a second element of the impedance matching circuit, the first element is a sensitive element of the impedance matching circuit with respect to the operating band, and the second element is a sub-sensitive element of the impedance matching circuit with respect to the operating band.

5. The communication apparatus according to claim 4, wherein a sensitivity of the first element with respect to the operating band is higher than a sensitivity of the second element with respect to the operating band.

6. The communication apparatus according to claim 1, wherein one terminal of the detection circuit is coupled between the antenna and the impedance matching circuit, and the other terminal of the detection circuit is coupled to the control unit.

7. The communication apparatus according to claim 6, wherein the communication apparatus further comprises a baseband signal processing unit coupled to the control unit.

8. The communication apparatus according to claim 6, wherein the control unit is a baseband signal processing unit of the communication apparatus.

9. The communication apparatus according to claim 1, wherein the communication apparatus further comprises a radio frequency transceiver coupled to the impedance matching circuit, one terminal of the detection circuit is coupled between the radio frequency transceiver and the impedance matching circuit, and the other terminal of the detection circuit is coupled to the control unit.

10. The communication apparatus according to claim 9, wherein the communication apparatus further comprises a baseband signal processing unit coupled to the control unit.

11. The communication apparatus according to claim 9, wherein the control unit is a baseband signal processing unit of the communication apparatus.

* * * * *